United States Patent
She et al.

(10) Patent No.: US 10,763,655 B2
(45) Date of Patent: Sep. 1, 2020

(54) LOW INDUCTANCE BUSBAR SYSTEMS AND METHODS

(71) Applicant: GENERAL ELECTRIC COMPANY, Schenectady, NY (US)

(72) Inventors: Xu She, Schenectady, NY (US); Rajib Datta, Niskayuna, NY (US); Ravisekhar Nadimpalli Raju, Clifton Park, NY (US); Maja Harfman-Todorovic, Schenectady, NY (US); Philip Michael Cioffi, Schaghticoke, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/124,169

(22) Filed: Sep. 6, 2018

(65) Prior Publication Data
US 2019/0006831 A1    Jan. 3, 2019

Related U.S. Application Data

(62) Division of application No. 15/336,453, filed on Oct. 27, 2016, now Pat. No. 10,103,534.

(51) Int. Cl.
*H05K 7/02* (2006.01)
*H02G 5/00* (2006.01)
(Continued)

(52) U.S. Cl.
CPC .............. *H02G 5/005* (2013.01); *H01G 9/26* (2013.01); *H02B 1/20* (2013.01); *H02G 5/00* (2013.01);
(Continued)

(58) Field of Classification Search
None
See application file for complete search history.

(56) References Cited

U.S. PATENT DOCUMENTS 3,520,987 A * 7/1970 Ohlrich .................. H02G 5/005
                                                     174/117 R
7,798,833 B2   9/2010 Holbrook
(Continued)

FOREIGN PATENT DOCUMENTS

| CN | 201893455 U | 7/2011 |
| CN | 102694356 A | 9/2012 |
| EP | 1 311 045 A1 | 5/2003 |

OTHER PUBLICATIONS

Chen et al., "Investigation, Evaluation, and Optimization of Stray Inductance in Laminated Busbar", Power Electronics, IEEE Transactions on, vol. 29 , Issue 7, pp. 3679-3693, Sep. 18, 2013.
(Continued)

*Primary Examiner* — Courtney L Smith
(74) *Attorney, Agent, or Firm* — The Small Patent Law Group LLC; Josef L. Hoffmann

(57) ABSTRACT

An electrical system includes a power electronics system and a bus bar coupled to the power electronic system. The power electronics system includes a switching device configured to selectively connect and disconnect. The bus bar includes a first conductive layer and a second conductive layer. The first conductive layer is disposed directly adjacent a first insulation layer, wherein the first conductive layer is configured to conduct a first polarity of electrical power to, from, or both the power electronics system. The second conductive layer is disposed directly adjacent the first insulation layer, and is configured to conduct a second polarity of electrical power opposite the first polarity to, from, or
(Continued)

both the power electronics system. The first conductive layer comprises a first thickness half a second thickness of the second conductive layer.

19 Claims, 5 Drawing Sheets

(51) Int. Cl.
| | |
|---|---|
| *H02M 7/00* | (2006.01) |
| *H01G 9/26* | (2006.01) |
| *H02B 1/20* | (2006.01) |
| *H01G 2/02* | (2006.01) |

(52) U.S. Cl.
CPC ............ *H02G 5/007* (2013.01); *H02M 7/003* (2013.01); *H05K 7/02* (2013.01); *H01G 2/02* (2013.01); *H05K 999/99* (2013.01)

(56) References Cited

U.S. PATENT DOCUMENTS

| | | | |
|---|---|---|---|
| 8,112,853 B2 | 2/2012 | Yoshinaga et al. | |
| 8,183,468 B2 * | 5/2012 | Kim ..................... | H01P 1/2005 174/258 |
| 8,193,449 B2 | 6/2012 | Esmaili et al. | |
| 9,042,112 B2 * | 5/2015 | Guan ................... | H05K 7/1432 361/676 |
| 9,083,128 B2 | 7/2015 | Pfeuffer et al. | |
| 9,627,139 B2 * | 4/2017 | Lee ....................... | H01G 2/065 |
| 2007/0019352 A1 * | 1/2007 | Anthony ................ | H01C 7/123 361/118 |
| 2008/0030961 A1 * | 2/2008 | Koo ..................... | H05K 1/0216 361/720 |
| 2010/0013073 A1 * | 1/2010 | Andry ................ | H01L 21/6835 257/686 |
| 2010/0302733 A1 | 12/2010 | Woody et al. | |
| 2012/0105145 A1 * | 5/2012 | Barowski ............. | H01L 23/481 327/565 |
| 2014/0111959 A1 | 4/2014 | Li et al. | |
| 2014/0209344 A1 * | 7/2014 | Kalayjian ........... | H05K 7/1432 174/68.2 |
| 2015/0035496 A1 | 2/2015 | Kikuchi | |

OTHER PUBLICATIONS

Extended European Search Report and Opinion issued in connection with corresponding EP Application No. 17197905.7 dated Feb. 26, 2018.

Office Action dated Jan. 7, 2020 for corresponding European Patent Application No. 19197905.7-1201.

Kail "Direct Flux Control for High Power Active Front Ends with Low Switching Frequency", Dec. 31, 2003, XP055654429.

* cited by examiner

LOW INDUCTANCE BUSBAR SYSTEMS AND METHODS

CROSS REFERENCE TO RELATED APPLICATIONS

This patent application is a divisional of U.S. Non-Provisional patent application Ser. No. 15/336,453 filed on Oct. 27, 2016, which is incorporated by reference herein in its entirety.

BACKGROUND

The subject matter disclosed herein relates to electrical systems and, more specifically, bus bars utilized in an electrical system.

Generally, an electrical system may include a bus bar to facilitate electrically connecting electrical devices. For example, a bus bar may be implemented to enable supplying DC electrical power from a power module that includes one or more switching devices (e.g., semiconductor switch, transistor, or power device) to an electrical load. In some instances, operation of switching devices may generate high levels of overvoltage in the bus bar structure due to the parasitic stray inductance. For example, when a switching device opens, the current in the bus bar changes, thereby resulting in a voltage spike, which may lead to voltage stress and/or affect operation of electrical devices (e.g., components).

BRIEF DESCRIPTION

Certain embodiments commensurate in scope with the original claims are summarized below. These embodiments are not intended to limit the scope of the claims, but rather these embodiments are intended only to provide a brief summary of possible forms of the claimed subject matter. Indeed, the claims may encompass a variety of forms that may be similar to or different from the embodiments set forth below.

In one embodiment, an electrical system includes a power electronics system and a bus bar coupled to the power electronic system. The power electronics system includes a switching device configured to selectively connect and disconnect. The bus bar includes a first conductive layer and a second conductive layer. The first conductive layer is disposed directly adjacent a first insulation layer, wherein the first conductive layer is configured to conduct a first polarity of electrical power to, from, or both the power electronics system. The second conductive layer is disposed directly adjacent the first insulation layer, and is configured to conduct a second polarity of electrical power opposite the first polarity to, from, or both the power electronics system. The first conductive layer comprises a first thickness half a second thickness of the second conductive layer.

In another embodiment, a method of manufacturing a bus bar used to electrically connect one or more electrical components includes coupling a first insulating layer to a first side of an interior positive layer, wherein the interior positive layer comprises a first thickness, coupling a second insulating layer to a second side of the interior positive layer, coupling a first intermediate negative layer to the first insulating layer, wherein the first intermediate negative layer comprises the first thickness, coupling a second intermediate negative layer to the second insulating layer, wherein the second intermediate negative layer comprises the first thickness, coupling a third insulating layer to the first intermediate negative layer, coupling a fourth insulating layer to the second intermediate negative layer, coupling a first external positive layer to the third insulating layer, wherein the first external positive layer comprises a second thickness different from the first thickness, and coupling a second external positive layer to the fourth insulating layer, wherein the second external positive layer comprises the second thickness.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Figure 1:
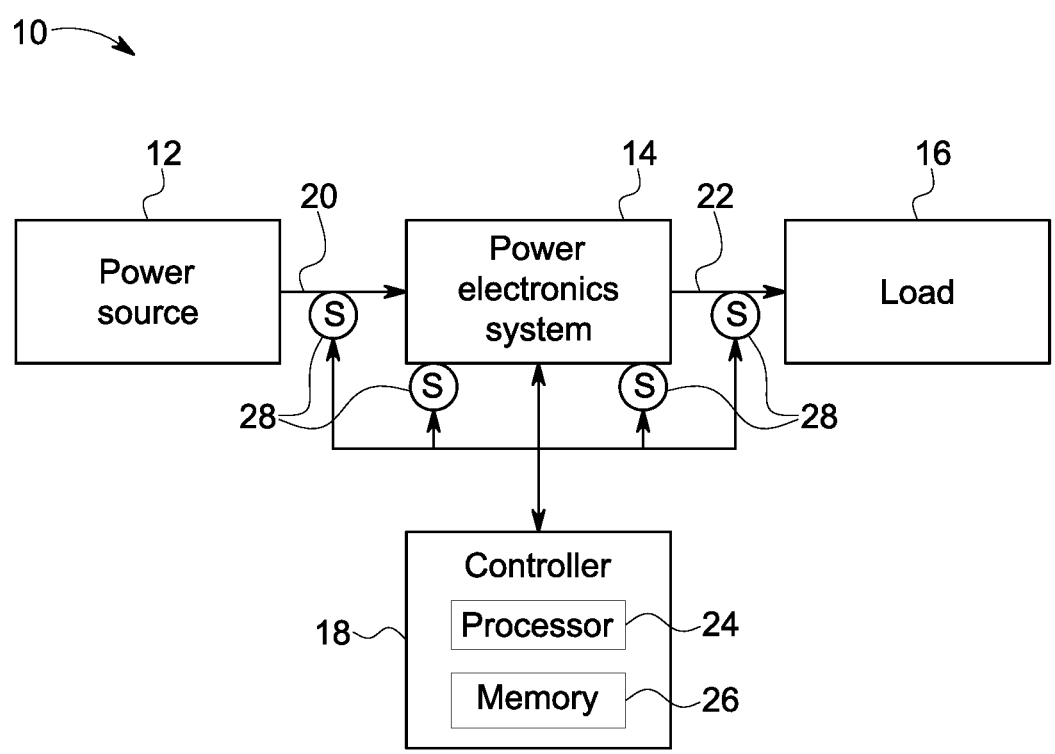
FIG. 1 is a perspective view of an electrical system, in accordance with an embodiment.

One embodiment of an electrical system 10 is shown in FIG. 1. In some embodiments, the electrical system 10 may be included in an industrial system, a manufacturing system, an automation system, or the like, such as a factory or plant. Additionally, in some embodiments, the electrical system 10 may be included in a computing system, such as a computer, or an automotive system, such as an airplane, boat, or car.

In the depicted embodiment, the electrical system 10 includes a power source 12 (e.g., an AC power source), a power electronics system 14, an electrical load 16 (e.g., a DC load), and a controller 18. As depicted, the power source 12 is electrically connected to the power electronics system 14 via a first electrical connection 20 (e.g., one or more bus bars), which may enable the power source 12 to supply electrical power to the power electronics system 14. Accordingly, in some embodiments, the power source 12 may be a power grid, an AC power generator, an alternator, or the like. In other embodiments, the power source may be a DC power source.

Additionally, in the depicted embodiment, the power electronics system 14 is electrically connected to the electrical load 16 via a second electrical connection 22 (e.g., a DC load), which may enable the power electronics system 14 to supply electrical power to the electrical load 16. In some embodiments, the electrical load 16 may store the electrical power and/or use the electrical power to perform an operation. Accordingly, in some embodiments, the electrical load 16 may be a battery, a computer, an engine control unit, a display, a light bulb, a heating, ventilating, and air conditioning (HVAC) system, or the like. In other embodiments, the electrical load 16 may be an AC load.

Thus, in operation, the power electronics system 14 may convert input electrical power received from the power source 12 into output electrical power supplied to the electrical load 16. In some embodiments, the power electronics system 14 may operate to convert input AC electrical power into output DC electrical power or vice versa. Additionally or alternatively, the power electronics system 14 may operate to convert input DC electrical power into output DC electrical power and/or to convert input AC electrical power into output AC electrical power, for example, to control (e.g., regulate) voltage and/or current supplied to the electrical load 16.

To facilitate conversion, the controller 18 may control operation of the power electronics system 14, for example, by instructing a switching device in the power electronics system 14 to open or close. Accordingly, the controller 18 may include a processor component 24 and a memory component 26. In some embodiments, the memory component 26 may include a tangible, non-transitory, computer readable medium that stores instructions executable by the processor component 24. Thus, in such embodiments, the memory component 26 may include random access memory (RAM), read only memory (ROM), rewritable non-volatile memory (e.g., flash memory), hard drives, optical discs, and/or the like. Additionally, the processor component 24 may include one or more general purpose microprocessors, one or more application specific processors (ASICs), one or more field programmable logic arrays (FPGAs), or any combination thereof. Additionally or alternatively, the controller 18 may utilize analog control based on op-amps, logic gates, and/or other control circuitry.

In some embodiments, the controller 18 may control operation of the power electronics system 14 based at least in part on measured operational parameters of the power electronics system 14, such as current of input electrical power, voltage of input electrical power, current of output electrical power, and/or voltage of output electrical power. To facilitate determining the operational parameters, one or more sensors 28 may be disposed on or coupled to the power electronics system 14, the first electrical connection 20, and/or the second electrical connection 22. In some embodiments, the sensors 28 may include temperature sensors, pressure sensors, voltage sensors, current sensors, power sensors, or any combination thereof. The sensors 28 may then communicate sensor data indicative of the measured operational parameters to the controller 18.

Based at least in part on the measured operational parameters, the controller 18 may control operation of the power electronics system 14, for example, to convert AC electrical power received from the power source 12 into voltage regulated DC electrical power to be supplied to the electrical load 16. As described above, the controller 18 may control operation of the power electronics system 14, for example, by instructing one or more switching devices in the power electronics system 14 to open or to close at specific times.

Figure 2:
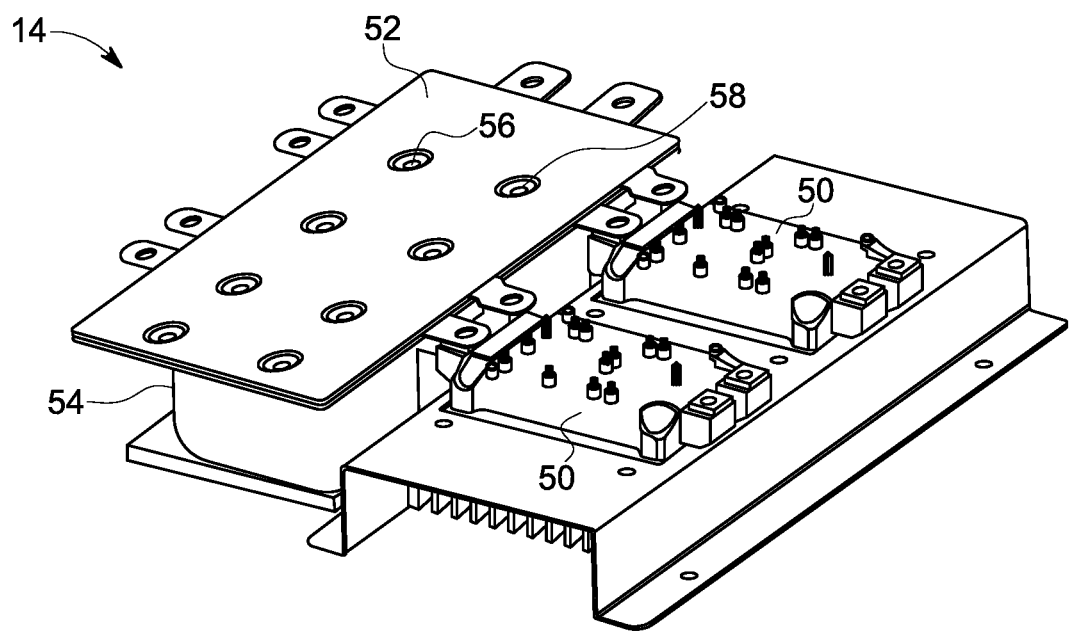
FIG. 2 is a perspective view of a power electronics system utilized in the electrical system of FIG. 1, in accordance with an embodiment.

To help illustrate, an example embodiment of the power electronics system 14 is shown in FIG. 2. As illustrated, the power electronics system 14 includes one or more switching devices 50. In some embodiments, a switching device 50 may include a semiconductor (e.g., silicon, silicon carbide, gallium nitride, or any other) switch and/or transistor. Additionally or alternatively, the switching device 50 may include a mechanical switch.

As described above, the power electronics system 14 may be electrically coupled to other electrical devices via one or more electrical connections. For example, the power electronics system 14 may be electrically connected to an electrical load 16 via a second electrical connection 22. Additionally or alternatively, the power electronics system 14 may be electrically connected to a power source 12 via a first electrical connection 20.

In some embodiments, an electrical connection may be implemented using one or more bus bars 52. For example, in the depicted embodiment, the bus bar 52 may electrically connect the switching device 50 to multiple capacitors 54 (e.g., electrical components or devices). In the illustrated embodiment, there are two capacitors 54 arranged in a 1×2 array. However, it should be noted that the depicted embodiment is merely intended to be illustrative. Thus, in other embodiments, any suitable number (e.g., 1, 2, 3, 4, 5, 6, 7, 8, 9, 10, 11, 12, 13, 14, 15, 16, or more capacitors) of capacitors 54 may be arranged in any suitable configuration (e.g., 1×1, 1×2, 2×2, 2×3, etc.).

To facilitate electrically connecting electrical components, the bus bar 52 may include one or more conductive layers. For example, in the depicted embodiment, a positive terminal of each capacitor 54 is coupled to the bus bar via a positive fastener 56 (e.g., screw). Thus, the bus bar 52 may include one or more positive layers. Additionally, in some embodiments, a positive fastener 56 may extend through the bus bar 52 to electrically connect the positive terminal of a corresponding capacitor 54 to each of the positive layers of the bus bar 52.

Additionally, in the depicted embodiment, a negative terminal of each capacitor 54 is coupled to the bus bar via a negative fastener 58 (e.g., screw). Thus, the bus bar 52 may include one or more negative layers. Additionally, in some embodiments, a negative fastener 58 may extend through the bus bar 52 to electrically connect the negative terminal of a corresponding capacitor 54 to each of the negative layers of the bus bar 52.

Figure 3:
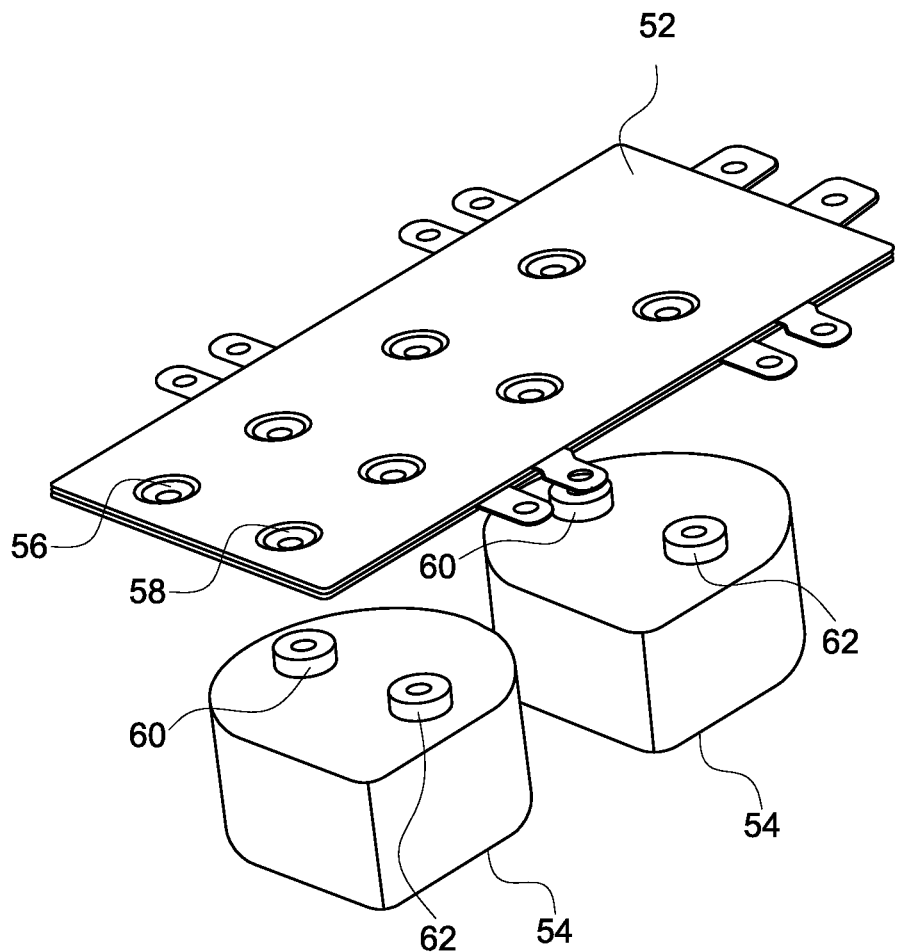
FIG. 3 is a perspective view of a bus bar utilized in the power electronics system shown of FIG. 2, coupled to two capacitors, in accordance with an embodiment.

As described above, other configurations of the capacitors 54 may be implemented. To help illustrate, another example embodiment of a bus bar 52 electrically coupled to the capacitors is shown in FIG. 3. In particular, the bus bar 52 is electrically connected to two capacitors 54 arranged in a 1×2 array.

Additionally, as shown, each capacitor 54 has a positive terminal 60 and a negative terminal 62. In some embodiments, the positive terminal 60 and/or the negative terminal 62 may include a threaded hole for receiving a fastener (e.g., a positive fastener 56 or a negative fastener 58). In other embodiments, the positive terminal 60 and/or the negative terminal 62 may include a threaded rod, which may extend up through and receive a nut to secure a corresponding capacitor 54 to the bus bar 52. In this manner, one or more capacitors 54 may be physically secured to and electrically connected to a bus bar 52.

Returning to FIG. 2, as described above, the switching devices 50 in the power electronics system 14 may operate (e.g., switch) to facilitate converting input electrical power into output electrical power. In particular, a switching device may selectively connect (e.g., close) and disconnect (e.g., open). In some embodiments, the switching devices 50 may switch at relatively high speeds, thereby resulting in larger changes in current over time (e.g., di/dt) and/or larger changes in voltage over time (e.g., dv/dt)

However, in some instances, change in voltage over time may generate electric fields that induce current in surrounding conductive components. Additionally, in some instances, change in current over time may generate magnetic fields that affect flow of electrical power. In other words, change in current over time in a bus bar 52 may result in voltage across the stray inductance in the bus bar 52, such as voltage drops and/or voltage spikes. The overvoltage may affect operation and/or reliability (e.g., life span) of the bus bar 52 and/or other electrical components (e.g., capacitors 54 or power electronics system 14).

In some embodiments, stray inductance may be reduced by implementing a laminated bus bar 52 to include a single positive layer and a single negative layer separated by an insulation layer. In this manner, magnetic field generated by flow of current through the positive layer may at least partially offset magnetic field generated by flow of current through the negative layer, thereby reducing stray inductance. However, magnetic fields offset distance between respective sources of the magnetic field. In the other words, magnetic fields generated with thinner insulation layer may offset to a larger degree than magnetic fields generated with thicker insulation layer.

To facilitate further reducing stray inductance, in some embodiments, a bus bar 52 may be implemented to include multiple parallel current paths. In particular, instead of a single positive layer and a single negative layer, the bus bar 52 may be implemented using multiple positive layers and multiple negative layers. To facilitate achieving relatively the same power rating, total volume (e.g., thickness, width, and/or height) of the multiple positive layers may be approximately equal to volume of the single positive layer. In this manner, bus bar 52 may conduct approximately the same magnitude of electrical power by dividing positive current between the multiple positive layer Similarly, total volume (e.g., thickness, width, and/or height) of the multiple negative layers may be approximately equal to volume of the single negative layer. In this manner, bus bar 52 may conduct approximately the same magnitude of electrical power by dividing negative current between the negative layers. Additionally, to facilitate offsetting generated magnetic field, the positive layers may be staggered between the negative layers such that each pair of adjacent conductive (e.g., positive or negative) layers is separated by an insulation layer.

Additionally, in some embodiments, the bus bar 52 may be implemented using an equal number of positive layers and negative layers with the same thickness. For example, a bus bar 52 may include four positive layers staggered between four negative layers and seven insulation layers separating each adjacent positive layer and negative layer pair. In this manner, magnetic field generated by each conductive layer may be closer to an offsetting magnetic field generated by an opposite polarity conductive layer, thereby further reducing stray inductance in a bus bar 52.

However, implementing equal number of positive layers and negative layers may increase implementation associated cost, such as component count and/or manufacturing complexity. For example, number of insulation layers utilized in a bus bar 52 may be increased (e.g., from one to seven). Additionally, total number of layer and, thus, total may be increased size of the bus bar 52 may be increased (e.g., from three to fifteen). Moreover, manufacturing complexity may increase to ensure that each fastener contacts the appropriate conductive layers (e.g., positive fastener 56 contacts each of the positive layers, but not the negative layers).

To facilitate reducing effect on implementation associated cost while maintaining improved stray inductance performance, other implementations of a bus bar 52 including multiple positive layers and/or multiple negative are considered. For example, in some embodiments, a bus bar 52 may be implemented such that number of positive layers differs from number of negative layers. Additionally or alternatively, a bus bar 52 may be implemented such that thickness of different conductive (e.g., positive or negative) layers differ.

Figure 4:
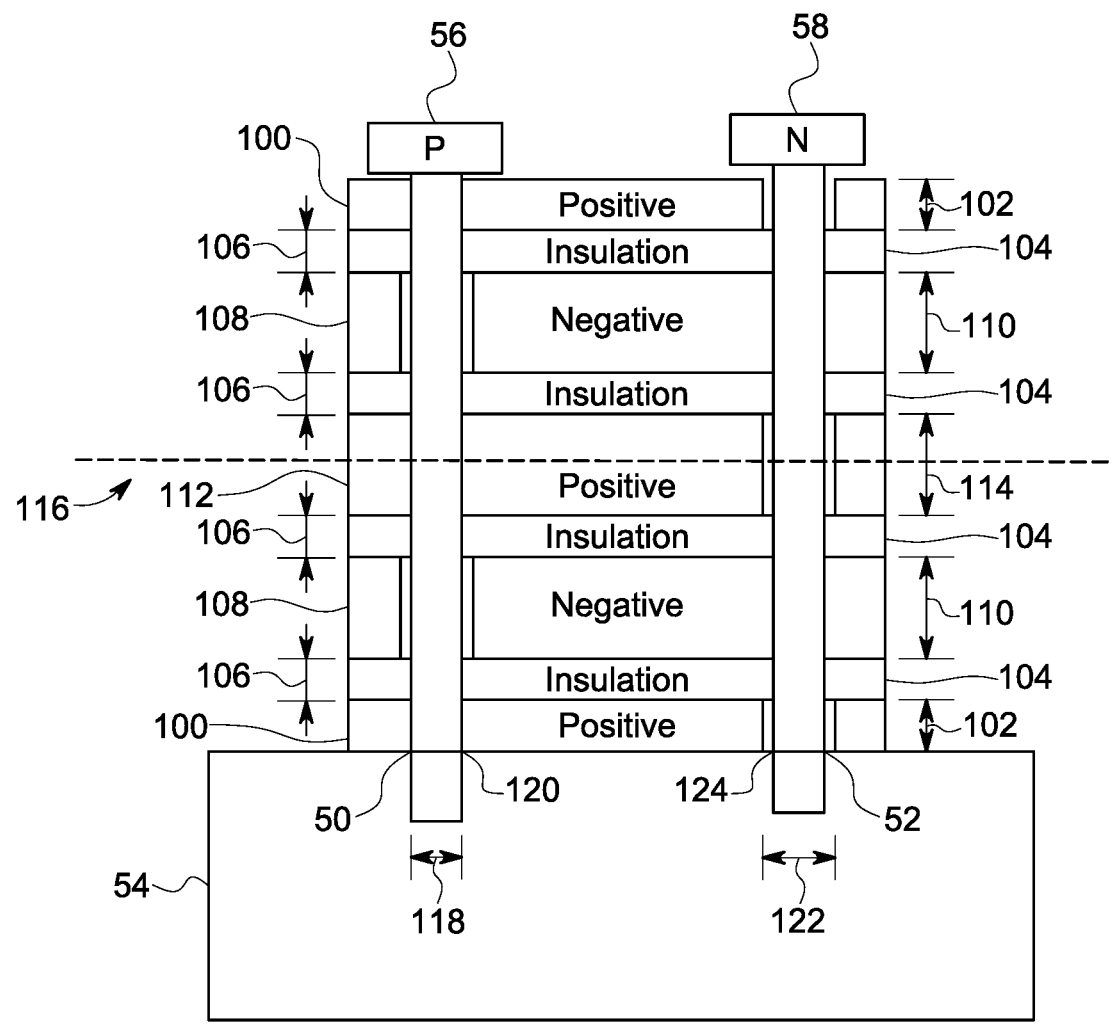
FIG. 4 is a side, section view of the bus bar having 9 layers, with the exterior conductive layers being half the thickness of the interior conductive layers, in accordance with an embodiment.

To help illustrate, an example embodiment of a bus bar 52 implemented with multiple negative layers and multiple positive layers coupled to a capacitor 54 is shown in FIG. 4. As depicted, the bus bar 52 includes external positive layers 100 each having a thickness 102 and an internal positive layer 112 have a thickness 114. Additionally, as depicted, the bus bar 52 includes two internal negative layers 108 each have a thickness 110. Thus, the bus bar 52 is implemented with different number of positive layers and negative layers.

To maintain electrical isolation, an insulation layer 104 having a thickness 106 is disposed between each adjacent pair of opposite polarity conductive layers. Thus, the bus bar 52 is implemented with four insulation layers 104 and nine total layers. In some embodiments, reducing number of insulation layers and/or reducing total number of layer may facilitate reducing implementation associated cost.

To facilitate reducing stray inductance, the thickness 114 of the internal positive layer 112 may approximately equal to the thickness 110 of each internal negative layer 108. Additionally, the thickness 102 of each external positive layer 100 may be approximately half the thickness 114 of the internal positive layer 112 and, thus, approximately half the thickness 110 of each internal negative layer 108. For illustrative purpose, the insulation layers 104 may have a thickness 106 of approximately 0.5 mm, the external positive layers 100 may each have a thickness 102 of approximately 1 mm, the internal negative layers 108 may each have a thickness 110 of approximately 2 mm, and the interior positive layer 112 may have a thickness 114 of approximately 2 mm.

It should be understood, however that other thicknesses 102, 106, 110, 114 may be possible. Similarly, other thickness ratios between layers may also be possible. In particular, in the above-described embodiment, the ratio between the thickness of each external layers to thickness of each of the internal layers is 2:1. However, other ratios may be possible. For example, in other embodiments, the ratio may be 1.5:1, 1.7:1, 1.75:1, 1.8:1, 1.9:1, 2.1:1, 2.2:1, 2.3:1, 2.4:1, 2.5:1, or any other ratio. Similarly, the ratios of the thickness 106 of the insulation layers 104 to the thicknesses 102, 110, 114 of the exterior layers 100 and the interior layers 108, 112 may vary.

It should be appreciated that in other embodiments a bus bar 52 may be implemented with the positive layers and the negative layers reversed. That is, the bus bar 52 may be implemented with three negative layers and two positive layers. Additionally, the external layers of the bus bar 52 may be negative layers, which are each half the thickness of an internal conductive layer. Further, though the bus bar 52 in FIG. 4 includes 5 conductive layers (e.g., one internal positive layer 112, two negative layers 108, and two external positive layers 100), it should be understood that other embodiments of the bus bar 52 may include any off number of conductive layers. That is, the bus bar 52 may include 3, 5, 7, 9, 11, 13, 15, 17, 19, or more layers.

In the illustrated embodiment, the bus bar 52 is symmetrical about a plane 116 that extends through the middle of the internal positive layer 112, parallel to the negative layers 108 and the external positive layers 100. The symmetry of the bus bar 52 cancels magnetic flux to improve the performance of the bus bar 52, however, embodiments of the bus bar 52 that are not symmetrical are also envisaged.

As illustrated, for each capacitor 54 connected to the bus bar 52, each layer has a pair holes, including a smaller diameter 118 hole 120 and a larger diameter 122 hole 124. The diameter difference between 118 and 122 depends on the insulation distance. As shown, the positive fastener 56 extends through the smaller diameter 118 holes 120 in the positive layers such that the positive fastener 56 is electrically connected to each of the external positive layers 100 and the internal positive layer 112. In this manner, each of the positive layers and the positive terminal 60 of the capacitor 54 are electrically coupled via the positive fastener 56. Additionally, the negative fastener 58 extends through the larger diameter 122 holes 124 in the internal negative layers 108, such that the negative fastener (e.g., screw) 58 electrically connected to each of the internal negative layers 108. In this manner, each of the negative layers and the negative terminal 62 of the capacitor 54 are electrically coupled via the negative fastener 58.

To facilitate maintaining electrical isolation between opposite polarity layers, as shown, the negative fastener 58 extends through the larger diameter 122 holes 124 of the positive layers, such that the negative fastener 58 is not electrically connected to any of the external positive layers 100 and the internal positive layer 112. Correspondingly, the positive fastener 56 extends through the larger diameter 122 holes 124 of the internal negative layers 108 such that the positive fastener 56 is not electrically connected to any of the internal negative layers 108. In this manner, the bus bar 52 may be implemented to create multiple parallel current paths.

In the illustrated embodiment, the positive layers 100, 112 and the negative layers 108 are made of copper. However, the some or all of the conductive layers 100, 108, 112 may be made of copper alloys, or a different conductive material. Similarly, the insulation layers 104 may be made of mylar, epoxy, or any other any insulating, non-conductive material.

Figure 5:
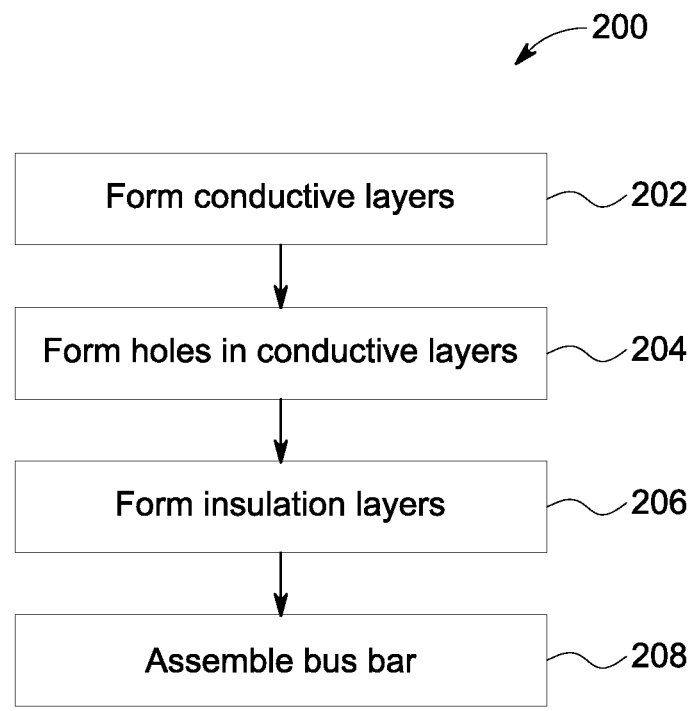
FIG. 5 is a flow chart of a process for manufacturing the bus bar of FIG. 4, in accordance with an embodiment.

FIG. 5 illustrated a process 200 for manufacturing a bus bar 52. In block 202, the various conductive layers may be formed individually. In block 204, the small diameter holes and large diameter holes may be formed (e.g., drilled) in each of the conductive layers as needed. For example, a small diameter hole and a large diameter hole may be drilled for each capacitor to which the bus bar is configured to couple. In block 206, the insulation layers may be formed. Holes may or may not be formed in the insulation layers at this time. In block 208, the bus bar may be assembled. In some embodiments, the bus bar may be assembled in a middle-out fashion such that insulation layers are coupled to either side of the internal positive layer. The negative layers may then be coupled to either of the insulation layers, followed by another pair of insulation layers, and then the external positive layers. In other embodiments, the bus bar may be assembled in a top-down or bottom-up fashion. For example, the various layers may be coupled to one another in the following order: external positive layer, insulation layer, negative layer, insulation layer, internal positive layer, insulation layer, negative layer, insulation layer, external positive layer. The various layers may be coupled to one another via laminating and plating processes.

Technical effects of the invention include by creating a number of parallel current paths through the bus bar, the stray inductance of the bus bar 52 may be reduced. The resultant bus bar, when paired with wide-band gap, high-speed switching devices, such as silicon carbide semiconductors, has a comparatively low stray inductance.

This written description uses examples to disclose the claimed subject matter, including the best mode, and also to enable any person skilled in the art to practice the disclosed subject matter, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An electrical system, comprising:
   a power electronics system comprising a switching device, wherein the switching device is configured to selectively connect and disconnect;
   a bus bar electrically coupled to the power electronics system, wherein the bus bar comprises:
      a first conductive layer disposed directly adjacent engaging a first insulation layer, wherein the first conductive layer is configured to conduct a first positive polarity of electrical power to, or from, or both the power electronics system; and
      a second conductive layer disposed directly adjacent engaging the first insulation layer, wherein the second conductive layer configured to conduct a second negative polarity of the electrical power opposite the first polarity to, or from, or both the power electronics system;
      wherein the first conductive layer comprises a first thickness that is one half of a second thickness of the second conductive layer;
   wherein the bus bar comprises a third conductive layer disposed directly adjacent a second insulation layer film, wherein:
   the third conductive layer is configured to conduct the first positive polarity of electrical power to, or from, or both the power electronics system in parallel with the first conductive layer; and
   the third conductive layer comprises a third thickness that is equivalent to the second thickness.

2. The electrical system of claim 1, wherein the bus bar comprises:
   a fourth conductive layer disposed directly adjacent a third insulation layer and directly adjacent a fourth insulation layer disposed directly adjacent the second conductive layer, wherein:

the fourth conductive layer is configured to conduct the first positive polarity of electrical power to, or from, or both the power electronics system in parallel with the first conductive layer and the third conductive layer; and
the fourth conductive layer comprises the second thickness; and
a fifth conductive layer disposed directly adjacent the second insulation layer and directly adjacent the third insulation layer, wherein:
the fifth conductive layer is configured to conduct the second negative polarity of the electrical power to, or from, or both the power electronics system in parallel with the second conductive layer; and
the fifth conductive layer comprises the first thickness.

3. The electrical system of claim 1, wherein the second conductive layer engages is disposed directly adjacent the second insulation layer.

4. An electrical system, comprising:
a power electronics system comprising a switching device, wherein the switching device is configured to selectively connect and disconnect;
a bus bar electrically coupled to the power electronics system, wherein the bus bar comprises:
a first conductive layer disposed directly adjacent engaging a first insulation layer, wherein the first conductive layer is configured to conduct a first positive polarity of electrical power to, or from, or both the power electronics system; and
a second conductive layer disposed directly adjacent engaging the first insulation layer, wherein the second conductive layer configured to conduct a second negative polarity of the electrical power opposite the first polarity to, or from, or both the power electronics system;
wherein the first conductive layer comprises a first thickness that is one half of a second thickness of the second conductive layer;
a capacitor coupled to an exterior surface of the bus bar, wherein the capacitor comprises:
a first terminal electrically connected to the first conductive layer; and
a second terminal electrically connected to the second conductive layer.

5. The electrical system of claim 4, comprising:
a first fastener that extends through the bus bar to:
secure the capacitor to the exterior surface of the bus bar;
electrically connecting the first terminal to the first conductive layer; and
electrically isolate the first terminal from the second conductive layer; and
a second fastener that extends through the bus bar to:
secure the capacitor to the exterior surface of the bus bar;
electrically connecting the second terminal to the second conductive layer; and
electrically isolate the first terminal from the first conductive layer.

6. The electrical system of claim 1, wherein the first insulation layer comprises a third thickness.

7. The electrical system of claim 1, wherein the bus bar is configured to:
enable the power electronics system to supply electrical power to an electrical load; or
enable the power electronics system to receive electrical power from a power source; or
both.

8. The electrical system of claim 1, wherein the power electronics system is configured to selectively connect and disconnect the switching device to facilitate converting input electrical power into output electrical power.

9. The electrical system of claim 1, wherein the electrical system comprises an industrial system, a manufacturing system, an automation system, a computing system, an automotive system, or any combination thereof.

10. A method of manufacturing a bus bar used to electrically connect one or more electrical components, comprising:
coupling engaging a first insulating layer to a first side of an interior first conductive layer, wherein the first conductive interior layer comprises a first thickness;
coupling engaging a second insulating layer to a second side of the interior first conductive layer;
coupling engaging a first intermediate second conductive layer to the second insulating layer, wherein the first intermediate second conductive layer comprises a second thickness that is equivalent of the first thickness;
coupling engaging a second intermediate third conductive layer to the first second insulating layer, wherein the second intermediate third conductive layer comprises a third thickness that is equivalent to the first thickness;
coupling a third insulating layer to the first intermediate second conductive layer;
coupling a fourth insulating layer to the second intermediate third conductive layer;
coupling a first external layer to the third insulating layer, wherein the first external layer comprises a second fourth thickness different from the first thickness; and
coupling a second external layer to the fourth insulating layer, wherein the second external layer comprises a fifth thickness equivalent to the second thickness.

11. The method of claim 10, wherein the first thickness is twice the second fourth thickness.

12. The method of claim 10, comprising:
electrically connecting the interior first conductive layer, the first external layer, and the second external layer in parallel; and
electrically connecting the first intermediate second conductive layer and the second intermediate third conductive layer in parallel.

13. The method of claim 10, comprising:
forming a first hole through the bus bar to facilitate securing a capacitor to the bus bar and electrically connecting a first terminal of the capacitor to the first conductive interior layer, the first external layer, and the second external layer; and
forming a second hole the bus bar to facilitate securing the capacitor to the bus bar and electrically connecting a second terminal of the capacitor to the first intermediate second conductive layer and the second intermediate third conductive layer.

14. The method of claim 13, wherein:
forming the first hole comprises:
forming the first hole with a first diameter in the first conductive interior layer, the first external layer, and the second external layer; and
forming the first hole with a second diameter greater than the first diameter in the first intermediate second conductive layer and the second intermediate third conductive layer; and forming the second hole comprises:
- forming the second hole with the second diameter in the interior layer, the first external layer, and the second external layer; and
- forming the second hole with first diameter in the first intermediate second conductive layer and the second intermediate third conductive layer.

15. The electrical system of claim 1, wherein the first conductive layer engages the first insulating layer on a first side, and the second conductive layer engages the first insulating layer on a second side that is opposite the first side.

16. The electrical system of claim 1, wherein the third conductive layer engages the second insulation layer.

17. The electrical system of claim 1, wherein the first conductive layer is configured to not conduct the negative polarity of the electric power.

18. The method of claim 10, wherein the first conductive layer is conducts a positive polarity of electrical power to or from a power electronics system, and the second conductive layer conducts a negative polarity of the electrical power to or from the power electronics system.

19. The method of claim 18, wherein the first conductive layer does not conduct the negative polarity of the electric power.

* * * * *